(12) United States Patent
Chang et al.

(10) Patent No.: US 7,692,290 B2
(45) Date of Patent: Apr. 6, 2010

(54) HEAT SLUG AND SEMICONDUCTOR PACKAGE

(75) Inventors: Yun Lung Chang, Kaohsiung (TW); Pin Hung Chiu, Kaohsiung (TW); Chun Chen Liu, Fongshan (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 7 days.

(21) Appl. No.: 12/251,116

(22) Filed: Oct. 14, 2008

(65) Prior Publication Data

US 2009/0039483 A1 Feb. 12, 2009

(30) Foreign Application Priority Data

Apr. 12, 2007 (TW) .............................. 96146074 A

(51) Int. Cl.
*H01L 23/10* (2006.01)
*H01L 23/34* (2006.01)

(52) U.S. Cl. ...................... 257/706; 257/675; 257/720; 257/796; 257/E33.075; 257/E31.131; 257/E23.051; 257/E23.08; 257/E23.102

(58) Field of Classification Search ................. 257/276, 257/625, 675, 706, 712–723, 796, E33.075, 257/E31.131, E23.051, E23.08–E23.113; 438/122, FOR. 413

See application file for complete search history.

(56) References Cited

FOREIGN PATENT DOCUMENTS

| JP | 2-56957 | * | 2/1990 | .................. 257/718 |
| TW | 494556 | | 7/2002 | |

* cited by examiner

*Primary Examiner*—Jasmine J Clark

(57) ABSTRACT

A heat slug includes a heat spreading member and a supporting member. The supporting member extends outwardly from the edge of the heat spreading member. The tips of the supporting member are formed with a plurality of contact portions, wherein each said contact portion has a bottom face inclined to the surface of the chip carrier art an angle of more that 5 degrees.

11 Claims, 3 Drawing Sheets

| | offsets of the contact portions of the heat slug prior to curing (unit : mil) | | | | | | | | | | | | | |
|---|---|---|---|---|---|---|---|---|---|---|---|---|---|---|
| | x-axis 0° | x-axis 1° | x-axis 3° | x-axis 5° | x-axis 10° | x-axis 15° | x-axis 20° | y-axis 0° | y-axis 1° | y-axis 3° | y-axis 5° | y-axis 10° | y-axis 15° | y-axis 20° |
| sample 1 offset | 8 | 7 | 2 | 3 | 2 | 1 | 1 | 1 | 2 | 5 | 2 | 1 | 2 | 1 |
| sample 2 offset | 8 | 7 | 4 | 5 | 3 | 2 | 2 | 2 | 3 | 3 | 3 | 2 | 1 | 1 |
| sample 3 offset | 3 | 8 | 5 | 0 | 2 | 3 | 2 | 2 | 1 | 2 | 2 | 3 | 2 | 2 |
| sample 4 offset | 10 | 7 | 1 | 0 | 2 | 2 | 1 | 4 | 1 | 0 | 3 | 2 | 2 | 1 |
| sample 5 offset | 2 | 1 | 5 | 4 | 3 | 1 | 1 | 1 | 4 | 4 | 3 | 3 | 2 | 1 |
| sample 6 offset | 9 | 8 | 5 | 5 | 2 | 2 | 1 | 5 | 4 | 4 | 0 | 3 | 2 | 2 |
| sample 7 offset | 3 | 1 | 4 | 4 | 2 | 2 | 2 | 2 | 4 | 3 | 3 | 2 | 2 | 1 |
| sample 8 offset | 5 | 5 | 3 | 3 | 2 | 2 | 1 | 1 | 0 | 5 | 0 | 2 | 1 | 1 |

FIG. 6

HEAT SLUG AND SEMICONDUCTOR PACKAGE

CROSS REFERENCE TO RELATED APPLICATION

This application claims the priority benefit of Taiwan Patent Application Serial Number 096146074 filed Dec. 4, 2007, the full disclosure of which is incorporated herein by reference.

BACKGROUND OF THE INVENTION

1. Field of the Invention

The invention relates to an element for semiconductor package and more particularly, to a heat slug and a semiconductor package.

2. Description of the Related Art

Nowadays, since the speed of a chip is more and more fast, it has been an important topic in the art to efficiently dissipate heat from the semiconductor package when the chip is operated at a high rate. A simple method of dissipating heat from the chip is to configure a heat slug on the semiconductor package.

Referring to FIG. 1, it illustrates a conventional semiconductor package 90 provided with a heat slug. The semiconductor package 90 includes a substrate 91, a chip 92, a die adhesive 93, a plurality of bonding wires 94, a heat slug 95 and a sealant 96. The chip 92 is bonded to the substrate 91 through the die adhesive 93. The bonding wires 94 are used to electrically connect the chip 92 to the substrate 91. The heat slug 95 is disposed above the chip 92 and adhered to the substrate 91 through an adhesive 97. The semiconductor package 90 is encapsulated with the sealant 96. The heat slug 95 has a heat spreading member 951 and a supporting member 952. The heat spreading member 951 is exposed from the sealant 96 to facilitate heat dissipation. The supporting member 952 extends downward from the edge of the heat spreading member 951 and the tip of the supporting member 952 is substantially parallel to the substrate 91. The tip of the supporting member 952 is adapted to support the heat slug 95 on the substrate 91 and adhered to the substrate 91.

However, when the adhesive 97 is used to attach the heat slug 95 to the substrate 91, the adhesive 97 is not usually cured immediately. In the meantime, if the heat slug 95 is subjected to an external side force or a shock, for example, when the substrate 91 along with the heat slug 95 is placed in a curing oven to cure the adhesive 97, the tip of the supporting member 952 is likely to have an offset.

The Taiwan Patent No. 494556, entitled "SEMICONDUCTOR PACKAGE WITH HEAT SLUG" discloses a method for preventing the heat slug from offset. The semiconductor package includes a substrate, a semiconductor chip, a heat slug and a sealant. The substrate at least has a first embedded portion. The semiconductor chip is disposed on the substrate. The heat slug has an outer exposed portion and an inner connecting portion. The inner connecting portion extends from the edge of the outer exposed portion and at least has a second embedded portion to have the heat slug positioned in place on the substrate. The sealant encapsulates the semiconductor chip and the inner connecting portion and the outer exposed portion is exposed from the sealant. Although the second embedded portion can be embedded in the first embedded portion to have the heat slug positioned in place on the substrate, it is required to modify the substrate in order to form an indentation on the substrate as the first embedded portion. Besides, the first embedded portion will occupy the space for circuit wiring on the substrate. This will increase the complexity in designing and manufacturing the substrate when the area of the substrate and the pitch of the wiring become gradually small.

Accordingly, there exists a need to provide a heat slug to solve the above-mentioned problems.

SUMMARY OF THE INVENTION

It is an object of the present invention to provide a heat slug, wherein the horizontal force exerted on the heat slug by the chip carrier can balance the external side force to prevent the heat slug from offset.

In order to achieve the above object, the heat slug of the present invention includes a heat spreading member and a supporting member. The supporting member extends outwardly from the edge of the heat spreading member and has a plurality of contact portions formed at the tip thereof. The each contact portion has a bottom face inclined to the upper surface of the chip carrier.

It is another object of the present invention to provide a semiconductor package, wherein the bottom faces of the contact portions of the heat slug are inclined to the upper surface of the chip carrier so that the chip carrier can exert a horizontal force on the heat slug to balance the external side force to prevent the heat slug from offset.

In order to achieve the above object, the semiconductor package of the present includes a chip carrier, a chip, a heat slug and a sealant. The chip is disposed on the upper surface of the chip carrier and electrically connected to the chip carrier. The heat slug includes a heat spreading member and a supporting member. The supporting member extends outwardly from the edge of the heat spreading member and has a plurality of contact portions formed at the tip thereof. The each contact portion has a bottom face inclined to the upper surface of the chip carrier. The tips of the contact portions are against the upper surface of the chip carrier to support the heat slug on the chip carrier. The sealant is formed on the upper surface of the chip carrier to encapsulate the chip and heat slug, wherein a portion of the heat spreading member is exposed from the sealant.

The contact portions are symmetrically formed at the corners of the heat slug and openings are optionally formed on the contact portions. The openings can be filled up with the adhesive to enhance the bonding of the heat slug to the chip carrier. The bottom face of the contact portion is preferably a plane that is inclined to the upper surface of the chip carrier at an angle of between 5 and 20 degrees.

BRIEF DESCRIPTION OF THE DRAWINGS

FIG. 6 is a table illustrating that the offsets of the contact portions of the heat slug of the present invention occur at different inclined angles of the bottom faces of the contact portions.

DETAILED DESCRIPTION OF THE PREFERRED EMBODIMENT

The foregoing, as well as additional objects, features and advantages of the invention will be more readily apparent from the following detailed description, which proceeds with reference to the accompanying drawings.

Figure 1:
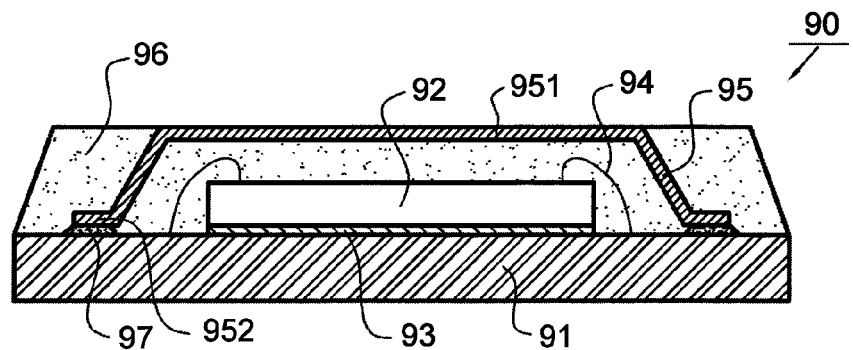
FIG. 1 is a cross-sectional view of a conventional semiconductor package provided with a heat slug.
Figure 2:
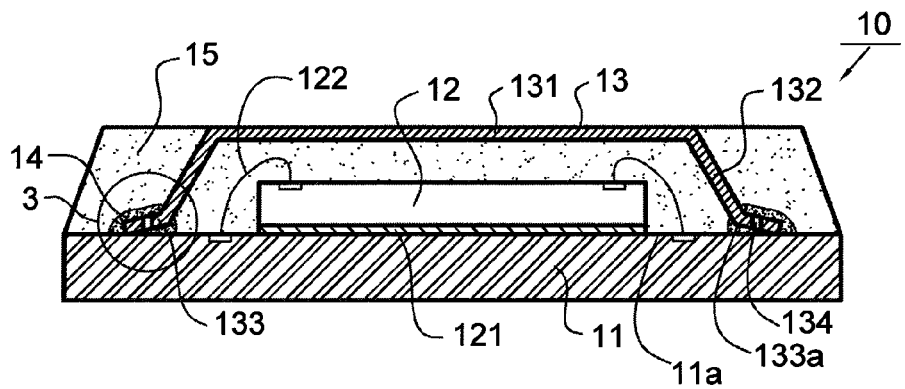
FIG. 2 is a cross-sectional view of the semiconductor package according to the present invention.

Referring to FIG. 2, it illustrates a cross-sectional view of the semiconductor package 10 according to the present invention. The semiconductor package 10 includes a chip carrier 11, a chip 12, a heat slug 13, an adhesive 14 and a sealant 15. The chip carrier 11 can be such as a substrate and has an upper surface 11a for carrying the chip 12 and heat slug 13. The upper surface 11a of the chip carrier 11 is provided with a plurality of bonding pads (not labeled in the figure) and a wiring trace (not shown in the figure).

The chip 12 is bonded to the chip carrier 11 through a die adhesive 121. The active surface of the chip 12 is provided with a plurality of bonding pads (not labeled in the figure). A plurality of bonding wires 122 is used to electrically connect the bonding pads on the chip 12 to the bonding pads on the upper surface 11a of the chip carrier 11.

Figure 3:
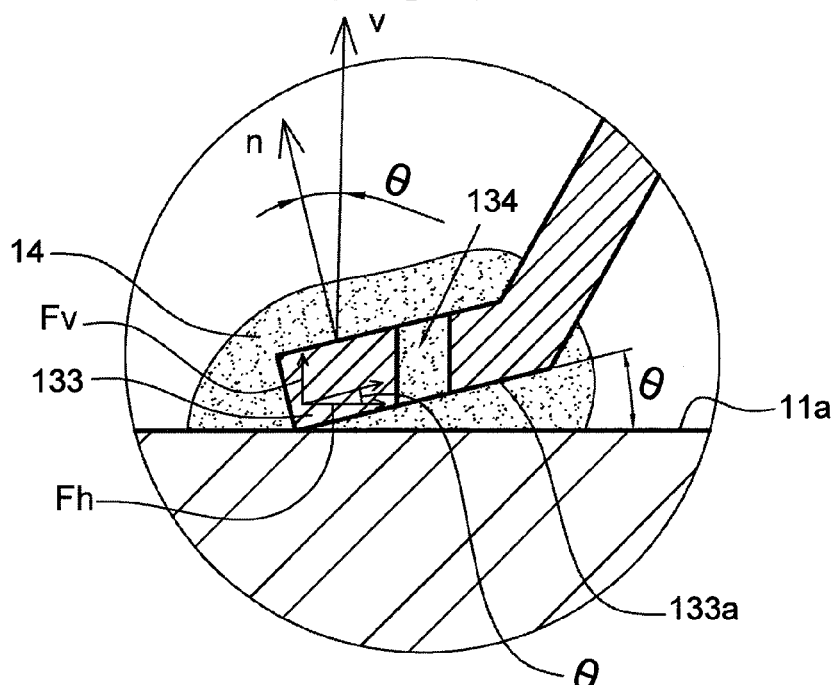
FIG. 3 is a locally enlarged view of the semiconductor package of FIG. 2.
Figure 4:
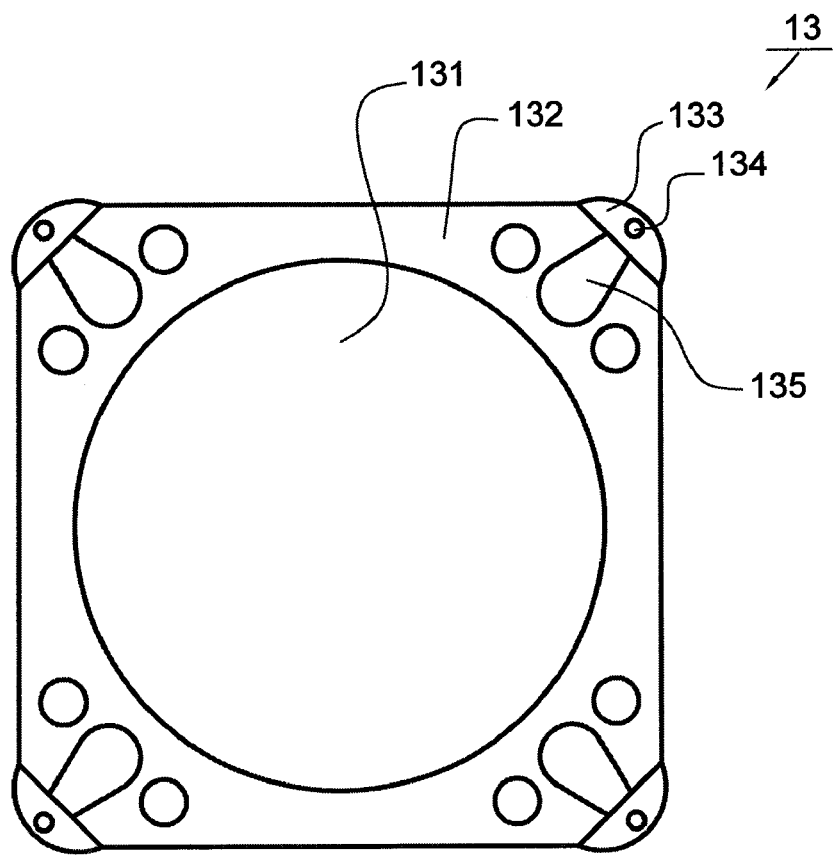
FIG. 4 is a top view of the heat slug according to the present invention.

Referring to FIGS. 2, 3 and 4, wherein FIG. 3 is a locally enlarged view of FIG. 2 and FIG. 4 is a top view of the heat slug 13 of the present invention. The heat slug 13 includes a heat spreading member 131 and a supporting member 132. The heat spreading member 131 can be circular but not limited to such shape. The supporting member 132 extends outwardly from the edge of the heat spreading member 131 and has a plurality of contact portions 133 formed at the tip thereof. The supporting member 132 further has a plurality of openings 135 formed between the heat spreading member 131 and contact portions 133 (see FIG. 4). When the sealant 15 is used to encapsulate the package 10, the melted sealant 15 can flow to the area enclosed between the heat slug 13 and chip carrier 11 through the openings 135 to encapsulate the chip 12. The sealant 15 can be an epoxy molding compound. It is preferred that the contact portions 133 are symmetrically formed at the corners of the heat slug 13. For example, the heat slug 13 illustrated in FIG. 4 is rectangular and the contact portions 133 are symmetrically formed at four corners of the rectangle. It is appreciated that the shape of the heat slug 13 is not limited to the rectangle and can also be a polygon.

The each contact portion 133 has a bottom face 133a that is preferably a plane but not limited to the plane. The bottom face 133a is at an angle θ with respect to the upper surface 11a of the chip carrier 11 (see FIG. 3). Specifically, the normal line n of the bottom face 133a of the contact portion 133 is at the angle θ with respect to the normal line v of the upper surface 11a of the chip carrier 11. In this way the tips of the contact portions 133 are against the upper surface 11a of the chip carrier 11 to support the heat slug 13 on the chip carrier 11. The adhesive 14 is used to attach the heat slug 13 to the upper surface 11a of the chip carrier 11. The adhesive 14 can be a thermosetting adhesive, such as a silver adhesive or an epoxy compound.

When the adhesive 14 is used to attach the heat slug 13 of the present invention to the chip carrier 11, the adhesive 14 is not usually cured immediately. In the meantime, since the bottom faces 133a of the contact portions 133 are at the angle θ with respect to the upper surface 11a of the chip carrier 11, i.e. inclined to the upper surface 11a of the chip carrier 11 at the angle θ, the force exerted on the chip carrier 11 due to the weight of the heat slug 13 can be decomposed into a horizontal and a vertical components with respect to the upper surface 11a of the chip carrier 11. Thus, according to the Newton's third law, the force exerted on the contact portions 133 of the heat slug 13 to support the heat slug 13 on the chip carrier 11 can be decomposed into a corresponding vertical component $F_v$ and a corresponding horizontal component $F_h$ (see FIG. 3). With such design approach, when the heat slug 13 is subjected to an external side force or a shock, the horizontal force $F_h$ can balance/resist the side force to prevent the heat slug 13 from offset. Furthermore, it is preferred that the adhesive 14 fills up the openings 134 and encloses the contact portions 133 so that the heat slug 13 can be firmly adhered to the chip carrier 11 by the adhesive 14.

Referring to FIG. 6, it illustrates the experiment results that the offsets of the contact portions of the heat slug 13 of the present invention occur in the horizontal (x-axis) and vertical (y-axis) directions at different inclined angles θ. As shown in the figure, when the inclined angle θ of the bottom face 133a of the contact portion 133 with respect to the upper surface 11a of the chip carrier 11 is greater than 5 degrees, the offsets of the heat slug 13 in both the horizontal and vertical directions are greatly reduced. However, when the inclined angle θ is greater than 20 degrees, it is unfavorable for the heat slug 13 to mount to the chip carrier 11. Therefore, it is preferred that the inclined angle θ of the bottom face 133a of the contact portion 133 with respect to the upper surface 11a of the chip carrier 11 is between 5 and 20 degrees.

Figure 5:
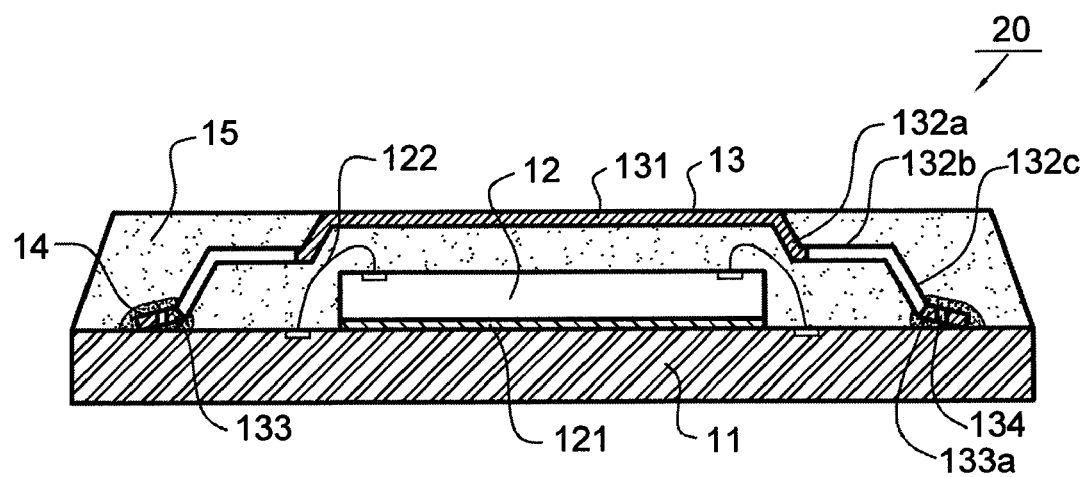
FIG. 5 is a cross-sectional view of the semiconductor package according to another embodiment of the present invention.

It should be understood that the shape of the supporting member 132 of the heat slug 13 is not limited to that illustrated in FIG. 2. The object of the present invention can be achieved without departing from the scope and spirit of the invention by only arranging the heat slug 13 in such a manner that the bottom faces 133a of the contact portions 133 are inclined to the upper surface 11a of the chip carrier 11. For example, referring to FIG. 5, it illustrates the semiconductor package 20 according to another embodiment of the present invention. The supporting member 132 of the heat slug 13 includes a plurality of first bent portions 132a, a plurality of extending portions 132b and a plurality of second bent portions 132c. The first bend portions 132a extends outwardly from the edge of the heat spreading member 131. The extending portions 132b extend horizontally and are formed between the first bent portions 132a and second bent portions 132c. The second bent portions 132c extend outwardly from the outer sides of the extending portions 132b and away from the heat spreading member 131 to connect with the contact portions 133. Other elements of FIG. 5 are the same as the corresponding elements in FIG. 2. Thus, any further illustrations of these elements will be omitted herein.

In conclusion, the heat slug can be fixed to the substrate by embedding the embedded portions with each other in a conventional semiconductor package. However, the arrangement of the embedded portions will occupy the space on the substrate. When the semiconductor package gets smaller, the design and production of substrate will become more difficult. Since the heat slug of the present invention has the inclined contact portions, the existing problem of the offset of the heat slug on the substrate can be solved. Besides, there is no need to increase the production cost of the heat slug. The heat slug of the present invention can also be used along with various heat slugs to increase the flexibility in designing the semiconductor package.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A heat slug adapted to be disposed on a chip carrier, comprising:
   a heat spreading member; and
   a supporting member extending outwardly from the edge of the heat spreading member and having a plurality of contact portions formed at the tip thereof, each said contact portion having a bottom face, wherein when the contact portions are against the surface of the chip carrier, the bottom faces of the contact portions are inclined to the surface of the chip carrier.

2. The heat slug as claimed in claim 1, wherein the contact portions are symmetrically formed at the corners of the heat slug.

3. The heat slug as claimed in claim 1, wherein the bottom faces are inclined to the surface of the chip carrier at an angle of between 5 and 20 degrees.

4. The heat slug as claimed in claim 1, wherein each said contact portion further has an opening formed thereon.

5. The heat slug as claimed in claim 1, wherein the heat spreading member is circular.

6. The heat slug as claimed in claim 1, wherein the bottom faces of the contact portions are planar.

7. A semiconductor package, comprising:
   a chip carrier having an upper surface;
   a chip disposed on the upper surface of the chip carrier and electrically connected to the chip carrier;
   a heat slug disposed above the chip, comprising:
      a heat spreading member; and
      a supporting member extending outwardly from the edge of the heat spreading member and having a plurality of contact portions formed at the tip thereof, each said contact portion having a bottom face inclined to the upper surface of the chip carrier, wherein the tips of the contact portions are against the upper surface of the chip carrier to support the heat slug on the chip carrier; and
   a sealant formed on the upper surface of the chip carrier to encapsulate the chip and heat slug, wherein a portion of the heat spreading member is exposed from the sealant.

8. The semiconductor package as claimed in claim 7, wherein the contact portions are symmetrically formed at the corners of the heat slug.

9. The semiconductor package as claimed in claim 7, wherein the bottom faces are inclined to the upper surface of the chip carrier at an angle of between 5 and 20 degrees.

10. The semiconductor package as claimed in claim 7, wherein each said contact portion further has an opening formed thereon.

11. The semiconductor package as claimed in claim 10, further comprising:
    an adhesive filled in the openings and adhered to the bottom faces of the contact portions.

\* \* \* \* \*